(12) United States Patent
Kim

(10) Patent No.: US 8,173,225 B2
(45) Date of Patent: May 8, 2012

(54) PHOTOCURABLE ORGANIC MATERIAL AND METHOD OF FABRICATING ARRAY SUBSTRATE FOR LIQUID CRYSTAL DISPLAY DEVICE USING THE SAME

(75) Inventor: Jin-Wuk Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 981 days.

(21) Appl. No.: 11/984,954

(22) Filed: Nov. 26, 2007

(65) Prior Publication Data

US 2008/0131617 A1 Jun. 5, 2008

(30) Foreign Application Priority Data

Nov. 30, 2006 (KR) .................. 10-2006-0119661

(51) Int. Cl.
C08F 2/48 (2006.01)
C08J 3/28 (2006.01)
(52) U.S. Cl. ........ 427/508; 427/271; 427/277; 427/510; 427/517; 427/518; 427/519
(58) Field of Classification Search .................. None
See application file for complete search history.

(56) References Cited

U.S. PATENT DOCUMENTS

| | | | |
|---|---|---|---|
| 6,719,915 B2* | 4/2004 | Willson et al. | 216/44 |
| 2004/0114059 A1* | 6/2004 | Lee et al. | 349/39 |
| 2004/0246319 A1* | 12/2004 | Ito et al. | 347/100 |
| 2005/0208779 A1 | 9/2005 | Klauk et al. | |
| 2006/0110545 A1 | 5/2006 | Toyoda | |

FOREIGN PATENT DOCUMENTS

| | | |
|---|---|---|
| CN | 1638019 A | 7/2005 |
| CN | 1743372 A | 3/2006 |
| TW | 200601430 A | 1/2006 |
| WO | WO 2006/031455 A2 * | 3/2006 |

* cited by examiner

Primary Examiner — Elena T Lightfoot
(74) Attorney, Agent, or Firm — Morgan, Lewis & Bockius LLP

(57) ABSTRACT

A method of fabricating an organic insulating layer used for an array substrate for a liquid crystal display device comprises forming a base material layer on a substrate; forming a photocurable organic material layer having a first liquid phase polymeric precursor, a second liquid phase polymeric precursor and a photo-initiator on the base material, the first liquid phase polymeric precursor having a single-functional group material, the second liquid phase polymeric precursor having at least one of a two-functional group material and a three-functional group material; disposing a stamp having a convex portion over the photocurable organic material layer; moving at least one of the substrate and the stamp such that the stamp depresses the photocurable organic material layer, wherein a contact hole, which exposes a portion of the base material layer and corresponds to the convex portion, is formed in the photocurable organic material layer; curing the photocurable organic material layer having the contact hole through the stamp; and detaching the stamp from the cured photocurable organic material layer.

9 Claims, 6 Drawing Sheets

PHOTOCURABLE ORGANIC MATERIAL AND METHOD OF FABRICATING ARRAY SUBSTRATE FOR LIQUID CRYSTAL DISPLAY DEVICE USING THE SAME

The present application claims the benefit of Korean Patent Application No. 2006-0119661 filed in Korea on Nov. 30, 2006, which is hereby incorporated by reference.

BACKGROUND OF THE INVENTION

1. Field of the Invention

The present invention relates to a liquid crystal display (LCD) device and more particularly to a photocurable organic material having an improved molecular density and a method of fabricating an organic insulating layer used for an array substrate for LCD device using the same.

2. Discussion of the Related Art

Since the LCD device has characteristics of light weight, thinness and low power consumption, the LCD device has been widely used as a substitute for a display device of cathode-ray tube type.

The LCD device uses optical anisotropy and polarization properties of liquid crystal molecules to display images. The liquid crystal molecules have orientation characteristics of arrangement resulting from their thin and long shape. Thus, an arrangement direction of the liquid crystal molecules can be controlled by applying an electrical field to them. Particularly, the LCD device including a thin film transistor (TFT) as a switching element, referred to as an active matrix LCD (AM-LCD) device, has excellent characteristics of high resolution and displaying moving images. Since the LCD device includes the TFT as the switching element, it may be referred to a TFT-LCD device.

Generally, the LCD device includes an array substrate, where a TFT and a pixel electrode are formed, a color filter substrate, where a color filter layer and a common electrode are formed, and a liquid crystal layer. The array substrate and the color filter layer face and are spaced apart from each other. The liquid crystal layer is interposed therebetween.

FIG. 1 is an exploded perspective view of a conventional LCD device. As shown in FIG. 1, the LCD device includes an array substrate 10, a color filter substrate 20 and a liquid crystal layer 30. The array substrate 10 and color filter substrate 20 face each other, and the liquid crystal layer 30 is interposed therebetween.

The array substrate includes a gate line 14, a data line 16, a TFT "Tr", and a pixel electrode 18 on a first substrate 12. The gate line 14 and the data line 16 cross each other such that a region formed between the gate and data lines 14 and 16 is defined as a pixel region "P". The TFT "Tr" is formed at a crossing portion between the gate and data lines 14 and 16, and the pixel electrode 18 is formed in the pixel region "P" and connected to the TFT "Tr".

The color filter substrate 20 includes a black matrix 25, a color filter layer 26, and a common electrode 28 on a second substrate 22. The black matrix 25 has a lattice shape to cover a non-display region of the first substrate 12, such as the gate line 14, the data line 16, the TFT "Tr", and so on. The color filter layer 26 includes first, second, and third sub-color filters 26a, 26b, and 26c. Each of the sub-color filters 26a, 26b, and 26c has one of red, green, and blue colors "R", "G", and "B" and corresponds to the each pixel region "P". The common electrode 28 is formed on the black matrix 25 and the color filter layers 26 and over an entire surface of the second substrate 22. The arrangement of the liquid crystal molecules is controlled by an electric field between the pixel electrode 18 and the common electrode 28 such that an amount of transmitted light is changed. As a result, the LCD device displays images.

Though not shown in FIG. 1, to prevent the liquid crystal layer 30 being leaked, a seal pattern may be formed along edges of the first and second substrates 12 and 22. First and second alignment layers may be formed between the first substrate 12 and the liquid crystal layer 30 and between the second substrate 22 and the liquid crystal layer 30. Polarizer may be formed on at least an outer surface of the first and second substrates 12 and 22.

Moreover, the LCD device includes a backlight assembly on an outer surface of the first substrate 12 to supply light to the liquid crystal layer 30. When a scanning signal is applied to the gate line 14 to control the TFT "Tr", a data signal is applied to the pixel electrode 18 through the data line 16 such that the electric field is induced between the pixel and common electrodes 18 and 28. As a result, the LCD device produces images using the light from the backlight assembly.

FIG. 2 is a cross-sectional view showing a conventional array substrate for an LCD device. As shown in FIG. 2, a first metal layer (not shown) is formed on a substrate 59 and is patterned through a first photolithography process to form a gate electrode 60 and a gate line (not shown). The gate electrode 60 is connected to the gate line (not shown). A gate insulating layer 68 is formed on the gate electrode 60 and the gate line (not shown). Next, an intrinsic amorphous silicon layer (not shown) and an impurity-doped amorphous silicon layer (not shown) are sequentially formed on the gate insulating layer 68 and patterned through a second photolithography process to form a semiconductor layer 70 having an active layer 70a and an ohmic contact layer 70b. The semiconductor layer 70 corresponds to the gate electrode 60. A second metal layer (not shown) is formed on the semiconductor layer 70 and patterned through a third photolithography process to form a data line 73, a source electrode 76 and a drain electrode 78. The data line 73 crosses the gate line (not shown) to define a pixel region "P". The source electrode 76 extends from the data line 73 and is spaced apart from the drain electrode 78. The source and drain electrodes 76 and 78 correspond to the semiconductor layer 70 and cover both end portions of the semiconductor layer 70, respectively. The gate electrode 60, the gate insulating layer 68, the semiconductor layer 70, the source electrode 76 and the drain electrode 78 constitute the TFT "Tr". A passivation layer 86 is formed on the data line 73, the source electrode 76 and a drain electrode 78. The passivation layer 86 is patterned through a fourth photolithography process to form a drain contact hole 80. The drain contact hole 80 exposes a portion of the drain electrode 78. Next, a transparent conductive material layer (not shown) is formed on the passivation layer 86 and patterned through a fifth photolithography process to form a pixel electrode 88 in each pixel region P. The pixel electrode 88 is connected to the drain electrode 78 through the drain contact hole 80.

Each photolithography process includes a step of forming a material layer, a step of forming a photoresist (PR) layer on the material layer, a step of disposing a mask over the PR layer, a step of exposing the PR layer using the mask, a step of developing the PR layer to form a PR pattern, a step of etching the material layer using the PR pattern as an etching mask to form the gate line, the data line, the gate electrode, a semiconductor layer, and so on. Since each photolithography process requires the mask, the photolithography process may be referred to as a mask process. The mask process requires apparatus for the depositing step, the exposing step, the developing step and the etching step. Accordingly, the mask process causes increase of production costs.

Recently, a method of fabricating an array substrate with less mask processes is introduced. For example, a fabricating process of a contact hole by an in-plane printing method does not require the mask process.

In the in-plane printing method, an organic material, such as photoacrylate, is coated to form an organic material layer. The organic material layer is depressed by a mold having a convex pattern. The organic material depressed by the convex pattern is squeezed such that the contact hole corresponding to the convex pattern is formed. Then, the organic material layer is cured by irradiating UV light. However, there are some problems in the in-plane printing method using photoacrylate.

FIG. 3 is a schematic view showing structure of photoacrylate after photopolymerization. In FIG. 3, a photo-initiator 94 activates polymer 90 such that the polymer 90 and an x-linker 92 are cross-linked to form a branched chain structure. The polymer 90 functions as a main chain 90a, and adjacent main chains 90a are linked by the x-linker 92. The polymer 90 has a pre-determined molecular weight and does not participate in the cross-linking reaction. The polymer 90 does nothing but be cross-linked by the x-linker 92. Accordingly, the photopolymerized polymer has an excellent elasticity due to the above branched chain structure. Unfortunately the excellent elasticity causes a poor hardness. The poor hardness causes damages on a surface of the organic material layer during the in-plane printing method. Moreover, when rubbing process is performed on the passivation layer, which is formed of the organic material by the in-plane printing method and exposed by the pixel electrode, damages are also generated because of the poor hardness. Furthermore, when contacting with rubbing clothes, the organic material layer may be peeled by friction with the rubbing clothes because of the poor hardness.

SUMMARY OF THE INVENTION

Accordingly, the present invention is directed to a photocurable organic material and a method of fabricating an array substrate for LCD device using the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating an organic insulating layer used for an array substrate for a liquid crystal display device comprises forming a base material layer on a substrate; forming a photocurable organic material layer having a first liquid phase polymeric precursor, a second liquid phase polymeric precursor and a photo-initiator on the base material, the first liquid phase polymeric precursor having a single-functional group material, the second liquid phase polymeric precursor having at least one of a two-functional group material and a three-functional group material; disposing a stamp having a convex portion over the photocurable organic material layer; moving at least one of the substrate and the stamp such that the stamp depresses the photocurable organic material layer, wherein a contact hole, which exposes a portion of the base material layer and corresponds to the convex portion, is formed in the photocurable organic material layer; curing the photocurable organic material layer having the contact hole through the stamp; and detaching the stamp from the cured photocurable organic material layer.

In another aspect of the present invention, a photocurable organic material comprises a first liquid phase polymeric precursor of 70% to 90% by weight, the first liquid phase polymeric precursor having a single-functional group material; a second liquid phase polymeric precursor of 7% to 27% by weight, the second liquid phase polymeric precursor having at least one of a two-functional group material and a three-functional group material; and a photo-initiator of 1% to 3% by weight.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

A photocurable organic material according to the present invention includes a first liquid phase polymeric precursor having a single-functional group material, a second liquid phase polymeric precursor having at least one of a two-functional group material and a three-functional group material, and a photo-initiator. The second liquid phase polymeric precursor may include both the two-functional group material and the three-functional group material. The photocurable organic material consists of the first liquid phase polymeric precursor with a range of 70 to 90 weight percentages, the second liquid phase polymeric precursor with a range of 7 to 27 weight percentages, and the photo-initiator with a range of 1 to 3 weight percentages.

Figure 1:
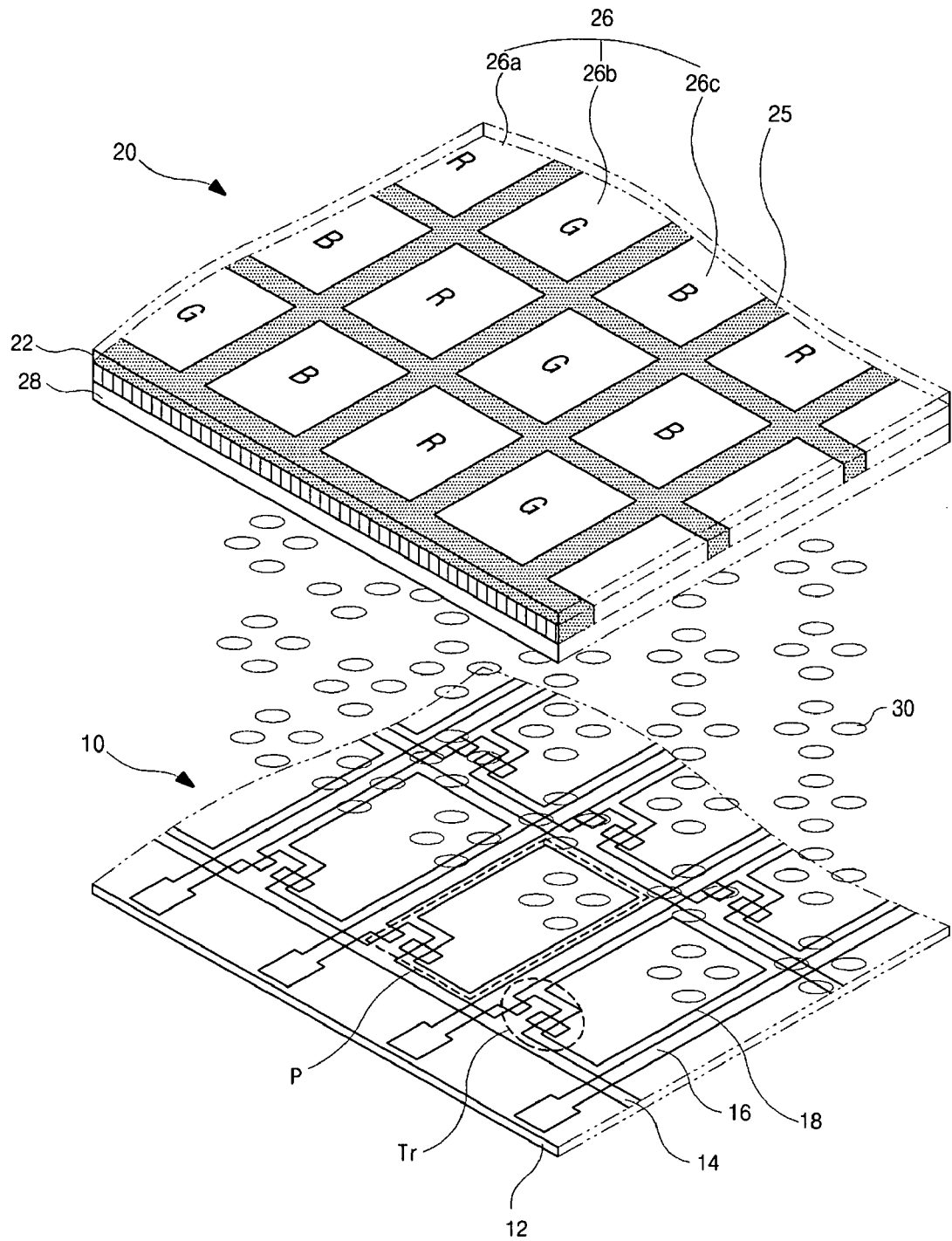
FIG. 1 is an exploded perspective view of a conventional LCD device.
Figure 2:
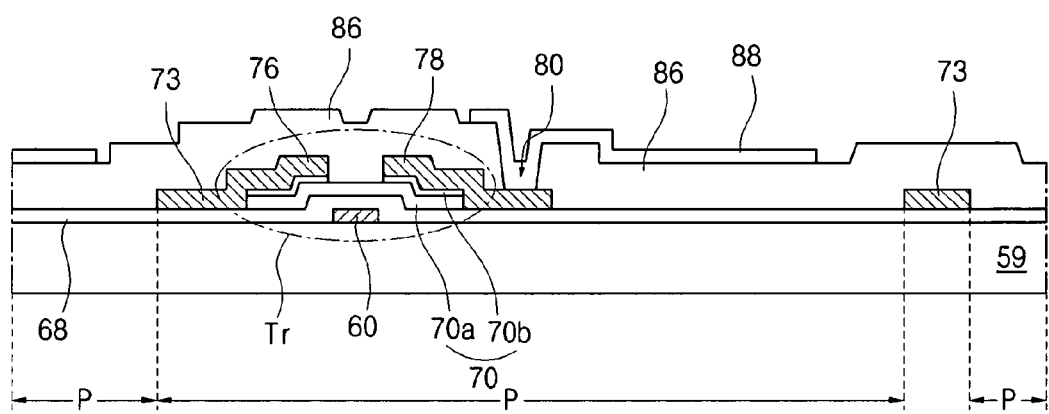
FIG. 2 is a cross-sectional view showing a conventional array substrate for an LCD device.
Figure 3:
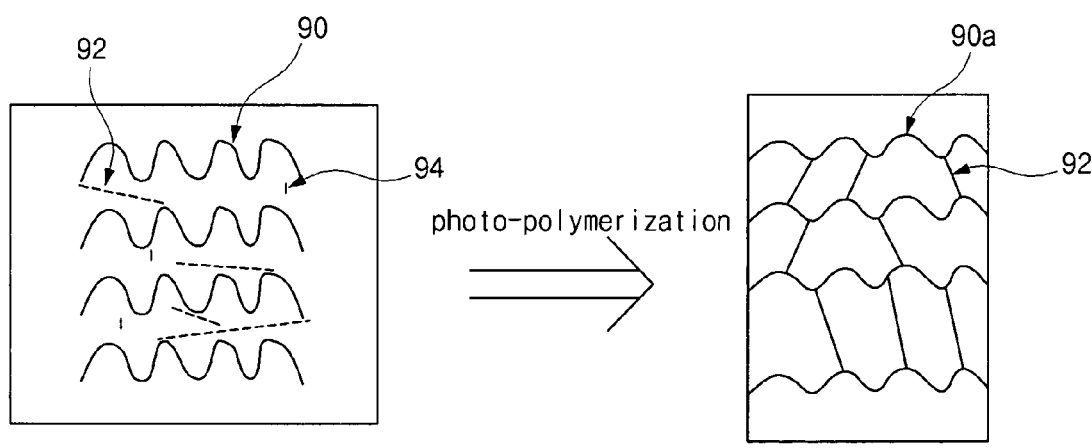
FIG. 3 is a schematic view showing a molecular structure of photoacrylate before and after photopolymerization.
Figure 4:
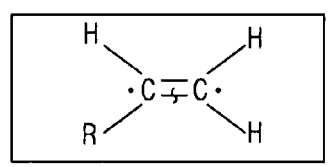
FIG. 4 is a schematic view showing a molecular structure of a precursor having a single-functional group material.

FIG. 4 is a schematic view showing a molecular structure of a precursor having a single-functional group material. In FIG. 4, a first liquid phase polymeric precursor includes a single-functional group material, which has a carbon-carbon double bond. The single-functional group material may be vinyl group. The first liquid phase polymeric precursor includes at least one of 2-(4-benzoyl-3-hydroxyphenoxy) ethyl acrylate, butyl methacrylate, hydroxyethyl acrylate, hydroxypropyl acrylate and iso-bornyl acrylate. When the first liquid phase polymeric precursor is activated under a condition, for example, UV light, one of the carbon-carbon double bond opens to generate radicals. And the radicals cause a photopolymerization as shown in FIG. 5.

Figure 5:
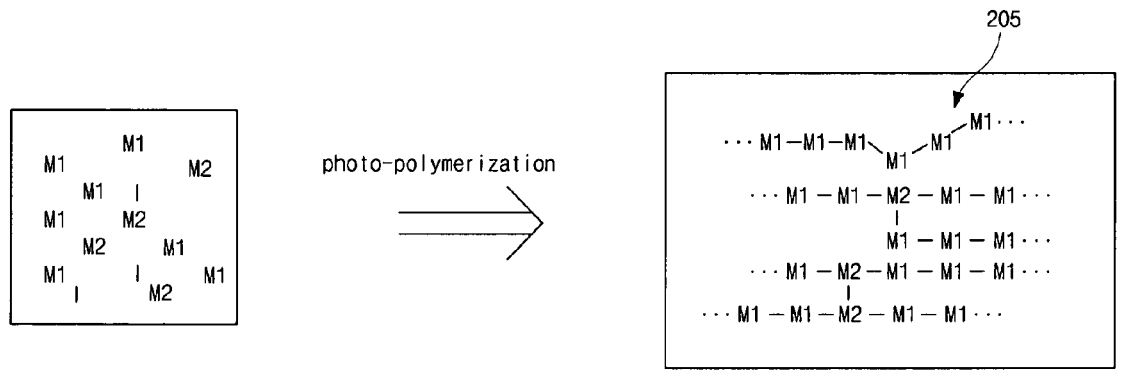
FIG. 5 is a schematic view showing a molecular structure of photoacrylate before and after photopolymerization.

In FIG. 5, UV light is irradiated into a photocurable organic material according to the present invention. As mentioned above, the photocurable organic material includes a first liquid phase polymeric precursor "M1" having a single-functional group material, a second liquid phase polymeric precursor "M2" having at least one of a two-functional group material and a three-functional group material, and a photo-initiator "I". The two-functional group material has two carbon-carbon double bonds, and the three-functional group material has three carbon-carbon double bonds. The photo-initiator "I" is activated by UV light, and photo-polymerization is processed between the first liquid phase polymeric precursors "M1" and between the first liquid phase polymeric precursor "M1" and the second liquid phase polymeric precursor "M2". The photo-polymerization between the first liquid phase polymeric precursors "M1" generates a main chain 205. Because the first liquid phase polymeric precursor "M1" has the single-functional group material, the main chain 205 has a straight chain structure. However, when the second liquid phase polymeric precursor "M2" participates in the main chain, one main chain is cross-linked to another main chain to form a branched chain structure because the second liquid phase polymeric precursor "M2" have at least one of the two-functional group material and the three-functional group material. At least one carbon-carbon double bond of the second liquid phase polymeric precursor "M2" opens to participate in the photo-polymerization. If the photocurable organic material only includes the first liquid phase polymeric precursor without the second liquid phase polymeric precursor, it has excellent density and hardness because of the only straight chain structure between the first liquid phase polymeric precursors. The hardness may be over 6 vickers hardness (H) after photo-polymerization. In this case, when there is an outer impact, the photocurable organic material layer may have damages. However, because the photocurable organic material includes not only the first liquid phase polymeric precursor "M1" but also the second liquid phase polymeric precursor "M2", the photocurable organic material layer has a hardness less than 6 vickers hardness (H) due to some branched chains. It is because at least two straight chain structures make a branched chain structure due to the second liquid phase polymeric precursor when at least two carbon-carbon double bonds of the second liquid phase polymeric precursor "M2" are opened. Accordingly, the hardness of the photocurable organic material layer after photo-curing may have a range of about 4 vickers hardness (H) to 6 about vickers hardness (H). In addition, the second liquid phase polymeric precursor "M2" functions as controller of reaction rate. The more the second liquid phase polymeric precursor "M2" is, the faster the reaction rate becomes. Moreover, the two-functional group material accelerates the photo-polymerization. If the reaction rate of the photo-polymerization is too fast, the photocurable organic material layer has poor adhesion properties onto a base layer. Accordingly, a volumetric ratio of the two-functional group material to the three-functional group material in the second liquid phase polymeric precursor "M2" is required to be controlled. Beneficially, a volumetric ratio of the two-functional group material to the three-functional group material in the second liquid phase polymeric precursor "M2" is about 1:1. The two-functional group material of the second liquid phase polymeric precursor "M2" includes at least one of di-ethylene glycol dimethacrylate and 1,6-hexanediol diacrylate. On the other hand, the three-functional group material of the second liquid phase polymeric precursor "M2" includes pentaerythritol triacrylate.

The photo-initiator "I" has a mono radical site with UV light during the photo-polymerization to activate the first and second liquid phase polymeric precursors "M1" and "M2". To have the above properties, the photo-initiator "I" may have one of phosphine oxide group and ketone group. For example, the photo-initiator "I" includes at least one of Irgacure 184, Irgacure 819 and Irgacure 369 of Ciba Specialty Chemicals.

Examples of an organic insulating layer, which is formed of a photocurable organic material according to the present invention, are as follows.

When an organic insulating layer is formed of iso-bornyl acrylate of 70%, 1,6-hexanediol diacrylate of 20%, pentaerythritol triacrylate of 7%, and Irgacure 369 of 3% by weight, the organic insulating layer has about 4 vickers hardness (H). When an organic insulating layer is formed of iso-bornyl acrylate of 90%, 1,6-hexanediol diacrylate of 1%, pentaerythritol triacrylate of 8%, and Irgacure 369 of 1% by weight, the organic insulating layer has about 4 vickers hardness (H). When an organic insulating layer is formed of iso-bornyl acrylate of 80%, 1,6-hexanediol diacrylate of 5%, pentaerythritol triacrylate of 12%, and Irgacure 369 of 3% by weight, the organic insulating layer has about 4 vickers hardness (H).

Alternatively, when an organic insulating layer is formed of butyl methacrylate of 70%, 1,6-hexanediol diacrylate of 13.5%, pentaerythritol triacrylate of 13.5%, Irgacure 369 of 1% and Irgacure 819 of 2% by weight, the organic insulating layer has about 5 vickers hardness (H).

As explained above, the photocurable organic material according to the present invention includes the first liquid phase polymeric precursor "M1" having the single-functional group material, the second liquid phase polymeric precursor "M2" having at least one of a two-functional group material and three-functional group material, and the photo-initiator "I". When the photocurable organic material is coated on a base material layer and cured by UV light, the photo-initiator "I", which has a mono radical site due to UV light, activates a photo-polymerization between the first liquid phase polymeric precursors "M1" and the second liquid phase polymeric precursors "M2" to form a main chain, which has a straight chain structure, and a cross-linked chain, which has a branched chain structure. Because the photocurable organic material includes the first liquid phase polymeric precursor "M1" with a range of 70 to 90 weight percentages and the second liquid phase polymeric precursor "M2" with a range of 7 to 27 weight percentages, the branched chain structures are sparsely generated. Accordingly, the photocurable organic material layer cured by UV light has a hardness with a range of about 4 vickers hardness (H) to about 6 vickers hardness (H). As a result, the photocurable organic material layer has a relatively low possibility of damages by an outer impact and rubbing process.

FIGS. 6A to 6F are cross-sectional views showing a fabricating process of an array substrate using a photocurable organic material according to the present invention. Although the photocurable organic material is used for forming a passivation layer in FIGS. 6A to 6F, it is possible to use the photocurable organic material for forming variable layers.

Figure 6A:
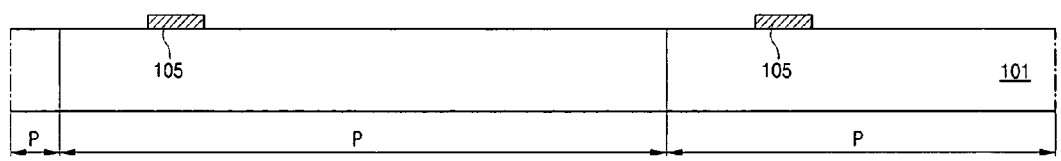
FIGS. 6A to 6F are cross-sectional views showing a fabricating process of an array substrate using a photocurable organic material according to the present invention.
Figure 6B:
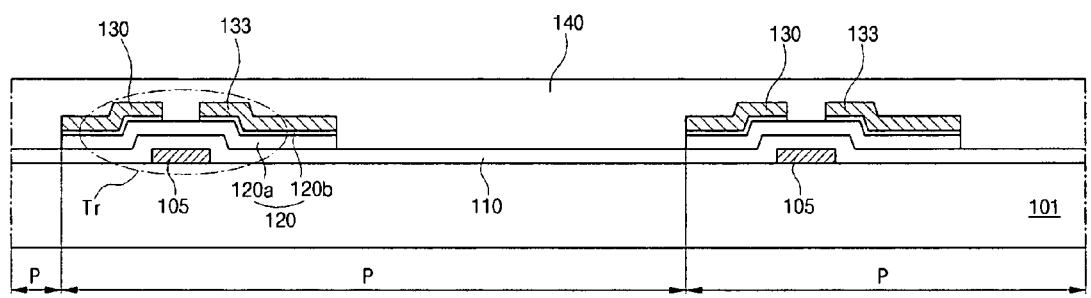

In FIG. 6A, a first metal layer (not shown) is formed on a substrate 101 and patterned by a first mask process to form a gate electrode 105 and a gate line (not shown) in each pixel region "P". Next, as shown in FIG. 6B, a gate insulating layer 110, an intrinsic amorphous silicon layer (not shown), an impurity-doped amorphous silicon layer (not shown), a second metal layer (not shown) are sequentially formed on the gate electrode 105 and the gate line (not shown). And then, the second metal layer (not shown), the impurity-doped amorphous silicon layer (not shown) and the intrinsic amorphous silicon layer (not shown) are patterned by a second mask process to form a semiconductor layer 120, which includes an active layer 120a and an ohmic contact layer 120b, a source electrode 130 and a drain electrode 133. The semiconductor layer 120, the source electrode 130 and the drain electrode 133 correspond to the gate electrode 105. The source and drain electrodes 130 and 133 are spaced apart from each other. The ohmic contact layer 120b between the source and drain electrodes 130 and 133 is etched to expose the active layer 120a. Although not shown, a data line of the second metal layer is also formed by the second mask process. The data line crosses the gate line such that the pixel region "P" is defined. The gate electrode 105, the gate insulating layer 110, the active layer 120a, the ohmic contact layer 120b, the source electrode 130 and the drain electrode 133 constitute a thin film transistor (TFT) "Tr". After the second mask process, a photocurable organic material layer 140 is formed on the source and drain electrodes 130 and 133. The photocurable material layer 140 includes the first liquid phase polymeric precursor "M1" having the single-functional group material, the second liquid phase polymeric precursor "M2" having at least one of the two-functional group material and the three-functional group material, and the photo-initiator "I". The first liquid phase polymeric precursor "M1" may have a weight percentage with a range of 70 to 90, the second first liquid phase polymeric precursor "M2" may have a weight percentage with a range of 7 to 27, and the photo-initiator "I" may have a weight percentage with a range of 1 to 3.

Figure 6C:
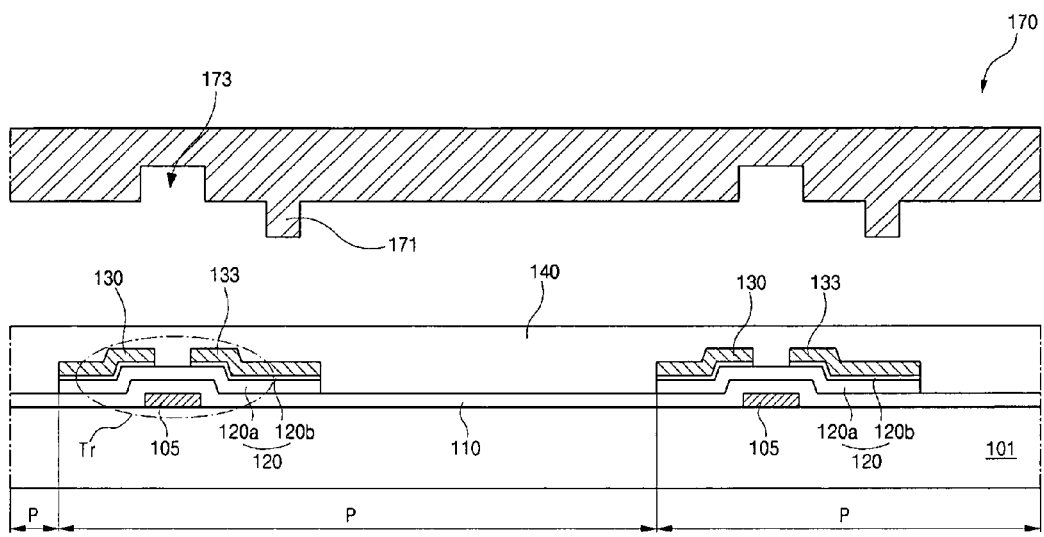
Figure 6D:
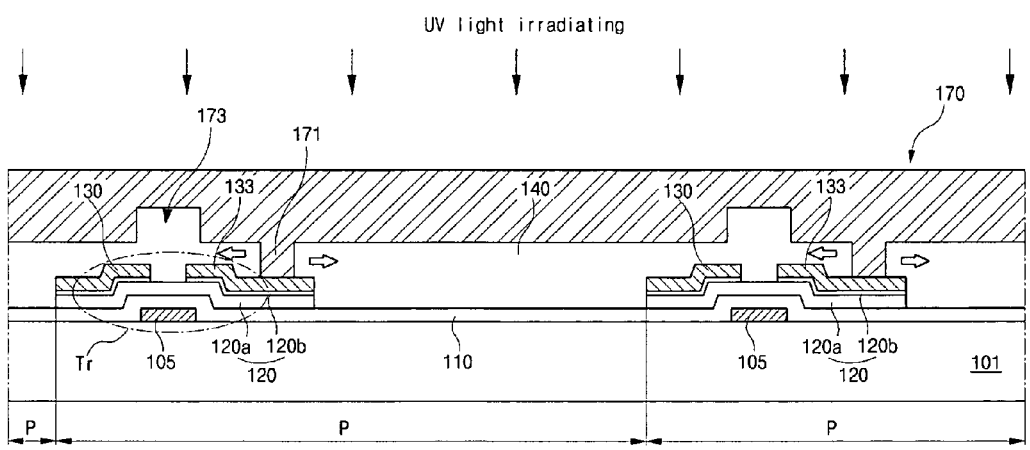
Figure 6E:
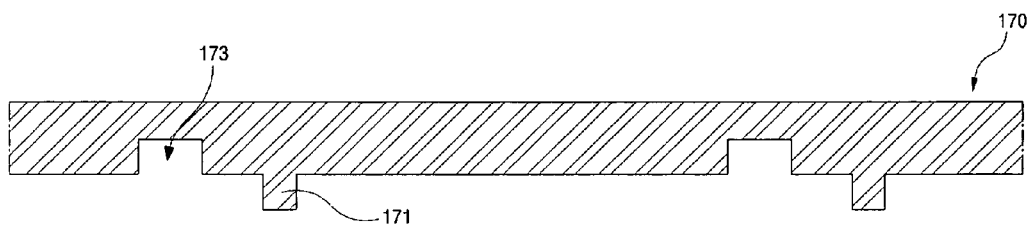
Figure 6E:
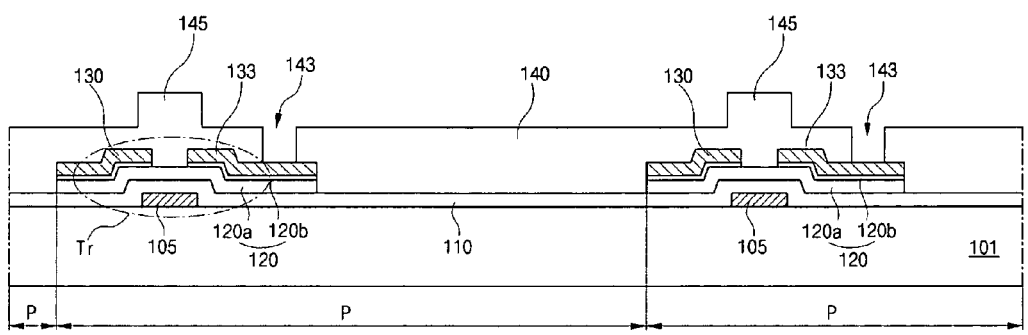

Next, as shown in FIG. 6C, a stamp 170 having a convex portion and 171a concave portion 173 is disposed over the photocurable organic material layer 140. Although the stamp has both the convex and concave portions in FIG. 6C, it may have one of the convex and concave portions. The stamp 170 is formed of a transparent material. The convex pattern corresponds to a portion of the drain electrode 133, and the concave portion 173 corresponds to a center portion of the TFT "Tr". And then, one of the substrate 101 and the stamp 170 moves to contact with the other. For example, the substrate 101 moves up and down. In FIG. 6D, the photocurable organic material layer 140 is depressed and pushed into left and right sides by the convex pattern 171 such that the convex pattern 171 contacts with the drain electrode 133. At the same time, the concave portion 173 is filled with the photocurable organic material layer 140. Then, UV light is irradiated onto the photocurable organic material layer 140 through the transparent stamp 170 to cure the photocurable organic material layer 140. As shown in FIG. 6E, the substrate 101 moves down to be detached from the stamp 170. As a result, a contact hole 143 and a spacer 145 are generated on the photocurable organic material layer 140. The contact hole 143 corresponds to the convex portion 171 of the stamp 170 such that the drain electrode 133 is exposed through the contact hole 143. The spacer 145 corresponds to the concave portion of the stamp 170. Accordingly, the spacer 145 protrudes from a surface of the photocurable organic material layer 140. The photocurable organic material layer 140 may be referred to as a passivation layer. The photocurable organic material layer 140 has a hardness with a range of 4 vickers hardness (H) to 6 vickers hardness (H). Moreover, when the photocurable organic material layer 140 has a thickness of about 400 nm, it has a light transmittance above about 95% and a dielectric constant of about 2.78.

Figure 6F:
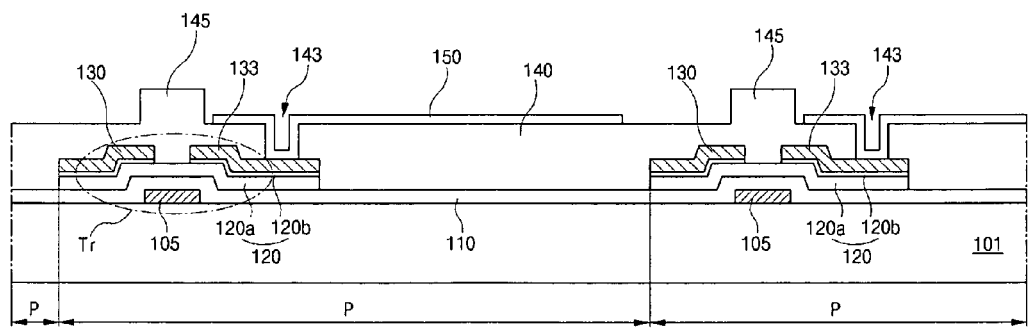

Next, in FIG. 6F, a transparent conductive material layer (not shown) is formed on the photocurable organic material layer 140 having the contact hole 143 and the spacer 145 and patterned through a third mask process to from a pixel electrode 150. The pixel electrode 150 contacts with the drain electrode 133 through the contact hole 143.

Although not shown, an alignment layer is formed on the pixel electrode 150, and a rubbing process is performed on the alignment layer. Moreover, when a color filter substrate is attached to the array substrate with a space, the spacer functions as keeping a uniformity of the space.

Then, an array substrate for an LCD device is fabricated by a three mask process. When a photocurable organic material according to the present invention is cured under UV light, it has a hardness with a range of 4 vickers hardness (H) to 6 vickers hardness (H) because it includes not only a first liquid phase polymeric precursor having a single-functional group material but also a second liquid phase polymeric precursor having at least one of a two-functional group material and a three-functional group material.

When a passivation layer of an array substrate is formed using a photocurable organic material, it is possible to reduce a mask process. Moreover, since the passivation layer of the photocurable organic material has the hardness with a range of 4 vickers hardness (H) to 6 vickers hardness (H), a possibility of damages resulted from an outer impact or a rubbing process is reduced. Accordingly, production cost is reduced and production yield is improved.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. A method of fabricating an organic insulating layer used for an array substrate for a liquid crystal display device, comprising:

forming a base material layer on a substrate;

forming a photocurable organic material layer having a first liquid phase polymeric precursor, a second liquid phase polymeric precursor and a photo-initiator on the base material, the first liquid phase polymeric precursor having a single-functional group material, the second liquid phase polymeric precursor having at least one of a two-functional group material and a three-functional group material;

disposing a stamp having a convex portion and a concave portion over the photocurable organic material layer, wherein the stamp has a first thickness corresponding to the convex portion, a second thickness corresponding to the concave portion and a third thickness corresponding to other portions excluding the concave and convex portions, wherein the third thickness is smaller than the first thickness and greater than the second thickness;

moving at least one of the substrate and the stamp such that the stamp depresses the photocurable organic material layer, wherein a contact hole, which exposes a portion of the base material layer and corresponds to the convex portion, is formed in the photocurable organic material layer and a spacer, which corresponds to the concave portion, is formed to protrude from the photocurable organic material layer;

curing the photocurable organic material layer having the contact hole through the stamp; and detaching the stamp from the cured photocurable organic material layer, wherein the first liquid phase polymeric precursor has a weight percentage with a range of 70 to 90, the second liquid phase polymeric precursor has a weight percentage with a range of 7 to 27, and the photo-initiator has a weight percentage with a range of 1 to 3, wherein the first liquid phase polymeric precursor includes at least one of 2-(4-benzoyl-3-hydroxyphenoxy)ethyl acrylate, butyl methacrylate, hydroxyethyl acrylate, hydroxypropyl acrylate and iso-bornyl acrylate, wherein the two-functional group material includes at least one of di-ethylene glycol dimethacrylate and 1,6-hexanediol diacrylate, wherein the three-functional group material includes pentaerythritol triacrylate, and wherein the cured photocurable organic material layer has a hardness with a range of 4 vickers hardness (H) to 6 vickers hardness (H).

2. The method according to claim 1, wherein the single-functional group material of the first liquid phase polymeric precursor includes a vinyl group.

3. The method according to claim 1, wherein the second liquid phase polymeric precursor having the two-functional group material and the three-functional group material, a volumetric ratio of the two-functional group material to the three-functional group material is 1:1.

4. The method according to claim 1, wherein the photo-initiator has at least one of a phosphine oxide group and a ketone group.

5. The method according to claim 1, wherein the step of curing the photocurable organic material layer is performed by irradiating a UV light onto the photocurable organic material layer.

6. The method according to claim 5, wherein the step of irradiating the UV light includes performing a photo-polymerization in the photocurable organic material layer to form a straight chain between the first liquid phase polymeric precursors and between the first liquid phase polymeric precursor and the second liquid phase polymeric precursor and a branched chain between the second liquid phase polymeric precursors.

7. The method according to claim 1, wherein the step of forming the base material layer comprises:
- forming a gate line and a gate electrode on the substrate, the gate electrode connected to the gate line;
- forming a gate insulating layer on the gate electrode and the gate line;
- forming a semiconductor layer on the gate insulating layer, the semiconductor layer corresponding to the gate electrode; and
- forming a data line, a source electrode and a drain electrode, the data line crossing the gate line, the source electrode connected to the data line and spaced apart from the drain electrode, the source and drain electrodes corresponding to the semiconductor layer, wherein the contact hole corresponds to the drain electrode.

8. The method according to claim 7, further comprising forming a pixel electrode on the cured photocurable organic material layer after detaching the stamp, wherein the pixel electrode is connected to the drain electrode through the contact hole.

9. The method according to claim 1, wherein when an opposing substrate is attached to the substrate, a distance between the substrate and the opposing substrate is uniformly maintained by the spacer.

* * * * *